United States Patent
Kim

(10) Patent No.: US 9,184,387 B2
(45) Date of Patent: Nov. 10, 2015

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-do (KR)

(72) Inventor: Jeong-Hun Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 168 days.

(21) Appl. No.: 13/952,427

(22) Filed: Jul. 26, 2013

(65) Prior Publication Data
US 2014/0239265 A1    Aug. 28, 2014

(30) Foreign Application Priority Data

Feb. 28, 2013   (KR) .................. 10-2013-0022446

(51) Int. Cl.
  *H01L 51/52*   (2006.01)
  *H01L 51/00*   (2006.01)
  *H01L 27/32*   (2006.01)

(52) U.S. Cl.
  CPC ........ *H01L 51/0013* (2013.01); *H01L 27/3246* (2013.01); *H01L 27/3211* (2013.01); *H01L 51/5209* (2013.01)

(58) Field of Classification Search
  CPC ..................... H01L 51/5203; H01L 51/56
  See application file for complete search history.

(56) References Cited

U.S. PATENT DOCUMENTS

| | | | | |
|---|---|---|---|---|
| 8,153,459 | B2* | 4/2012 | Choi | 438/29 |
| 2003/0146695 | A1* | 8/2003 | Seki | 313/506 |
| 2007/0257253 | A1* | 11/2007 | Im et al. | 257/40 |
| 2011/0175095 | A1* | 7/2011 | Kang et al. | 257/59 |

FOREIGN PATENT DOCUMENTS

| | | | |
|---|---|---|---|
| KR | 10-2007-0055908 A | | 5/2007 |
| KR | 10-2007-0096702 A | | 10/2007 |
| KR | 10-2010-0125502 A | | 12/2010 |
| KR | 10-2011-0081695 A | | 7/2011 |

* cited by examiner

*Primary Examiner* — Lex Malsawma
(74) *Attorney, Agent, or Firm* — Christie, Parker & Hale, LLP

(57) ABSTRACT

Provided are an organic light-emitting display apparatus having a very low defect rate in a manufacturing process, and a method of manufacturing the organic light-emitting display apparatus. The organic light-emitting display apparatus includes: a substrate; a planarization layer covering the substrate and having a top surface including a recessed portion; a pixel electrode in the recessed portion of the planarization layer; a step forming unit on the top surface of the planarization layer outside of the recessed portion; and a pixel-defining layer exposing at least a central portion of the pixel electrode, and covering the step forming unit so that a top surface of the pixel-defining layer includes a protruding portion corresponding to the step forming unit.

15 Claims, 13 Drawing Sheets

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2013-0022446, filed on Feb. 28, 2013, in the Korean Intellectual Property Office, the disclosure of which is incorporated herein in its entirety by reference.

BACKGROUND

1. Field

The present invention relates to an organic light-emitting display apparatus and a method of manufacturing the same, and more particularly, to an organic light-emitting display apparatus having a very low defect rate in a manufacturing process and a method of manufacturing the organic light-emitting display apparatus.

2. Description of the Related Art

An organic light-emitting display apparatus is a display apparatus that includes an organic light-emitting device including a plurality of subpixels, which each include two electrodes facing each other and an intermediate layer, including an emission layer (EML), between the two electrodes. Because the organic light-emitting display apparatus controls each subpixel to emit light and controls the amount of light emitted from each subpixel using a thin-film transistor (TFT), the organic light-emitting display apparatus may include a TFT on a substrate and an organic light-emitting device on the TFT and electrically connected to the TFT.

A conventional organic light-emitting display apparatus may have a defect rate that is high when an intermediate layer for each of a plurality of subpixels is formed and a manufacturing process is complex. For example, a mask having small through-holes respectively corresponding to subpixels may be used in order to deposit different light-emitting materials according to subpixel regions. As a resolution of an organic light-emitting display apparatus increases, the through-holes of the mask get smaller and denser, making it difficult to accurately deposit the light-emitting materials, and thereby causing defects.

SUMMARY

The present invention provides an organic light-emitting display apparatus having a very low defect rate in a manufacturing process and a method of manufacturing the organic light-emitting display apparatus.

According to an aspect of the present invention, there is provided an organic light-emitting display apparatus including: a substrate; a planarization layer covering the substrate and having a top surface including a recessed portion; a pixel electrode in the recessed portion of the planarization layer; a step forming unit on the top surface of the planarization layer outside of the recessed portion; and a pixel-defining layer exposing at least a central portion of the pixel electrode, and covering the step forming unit so that a top surface of the pixel-defining layer includes a protruding portion corresponding to the step forming unit.

The pixel electrode and the step forming unit may be spaced apart from each other and may not contact each other.

The organic light-emitting display apparatus may further include an emission layer on a portion of the pixel electrode not covered by the pixel-defining layer, and on a top surface of the protruding portion of the pixel-defining layer.

The emission layer on the portion of the pixel electrode not covered by the pixel-defining layer and the emission layer on the top surface of the protruding portion of the pixel-defining layer may be spaced apart from each other.

The pixel electrode and the step forming unit may include a same material.

The pixel electrode and the step forming unit may have a same layer structure.

The step forming unit may surround the pixel electrode on the planarization layer.

The organic light-emitting display apparatus may further include a neighboring pixel electrode adjacent to the pixel electrode. Here, the planarization layer may include a neighboring recessed portion adjacent to the recessed portion and spaced apart from the recessed portion, the neighboring pixel electrode may be in the neighboring recessed portion, and the step forming unit may be between the pixel electrode and the neighboring pixel electrode.

According to an aspect of the present invention, there is provided a method of manufacturing an organic light-emitting display apparatus, the method including: forming a planarization layer covering a substrate and having a top surface including a recessed portion; forming a pixel electrode in the recessed portion of the planarization layer; forming a step forming unit on the top surface of the planarization layer outside of the recessed portion; and forming a pixel-defining layer that exposes at least a central portion of the pixel electrode, and covers the step forming unit so that a top surface of the pixel-defining layer includes a protruding portion corresponding to the step forming unit.

The forming of the pixel electrode and the step forming unit may include forming the pixel electrode and the step forming unit such that the pixel electrode and the step forming unit are spaced apart from each other and are not contacting each other.

The forming of the planarization layer may include forming the planarization layer using a half-tone mask.

The method may further include: forming an emission layer on a portion of the pixel electrode not covered by the pixel-defining layer and on a top surface of the protruding portion of the pixel-defining layer.

The forming of the emission layer may include forming the emission layer using laser-induced thermal imaging.

The forming of the pixel electrode and the step forming unit may include forming the pixel electrode and the step forming unit using a same material.

The forming of the pixel electrode and the step forming unit may include concurrently forming the pixel electrode and the step forming unit.

The step forming unit may surround the pixel electrode on the planarization layer.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
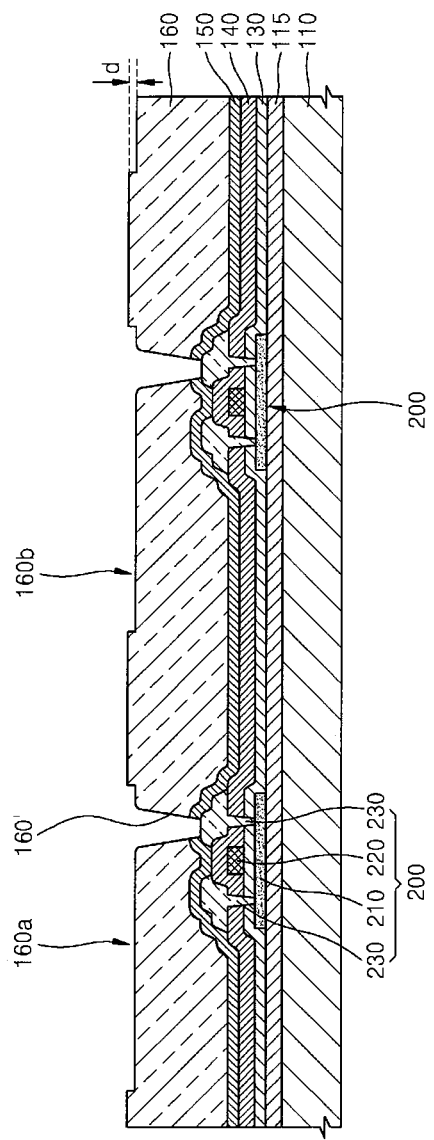
FIGS. 1 through 8 are cross-sectional views illustrating a method of manufacturing an organic light-emitting display apparatus according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. Sizes of elements may be exaggerated or minimized for convenience of explanation. For example, sizes and thicknesses of elements in the drawings are arbitrarily shown for convenience of explanation, and thus, the present invention is not limited thereto.

It will also be understood that when a layer is referred to as being "on" another layer or a substrate, it can be directly on the other layer or substrate, or one or more intervening layers may also be present therebetween.

FIGS. 1 through 8 are cross-sectional views illustrating a method of manufacturing an organic light-emitting display apparatus according to an embodiment of the present invention.

A substrate 110 is prepared. The substrate 110 may include any of a variety of materials, such as a glass material, a metal material, or a plastic material (such as polyethylene terephthalate (PET), polyethylene naphthalate (PEN), or polyimide). A thin-film transistor (TFT) 200 may be disposed on the substrate 110. In one embodiment, before the TFT 200 is formed, a layer, such as a buffer layer 115, may be formed on the substrate 110. The buffer layer 115 may be formed over an entire surface of the substrate 110 or may be formed by being patterned.

The buffer layer 15 may include any of a variety of materials, such as PET, PEN, polyacrylate, or polyimide, to have a single-layer or multi-layer structure. Alternatively, the buffer layer 115 may include silicon oxide or silicon nitride, or may be formed as a composite film including an organic material and an inorganic material.

Each TFT 200 may control one of a plurality of subpixels to emit light or control the amount of light emitted from the subpixel. The TFT 200 may include a semiconductor layer 210, a gate electrode 220, and source/drain electrodes 230.

The semiconductor layer 210 may be formed as an amorphous silicon layer, an oxide layer, or a polycrystalline silicon layer, or may include an organic semiconductor material. Although not shown in FIG. 1, in one embodiment, the semiconductor layer 210 may include a source region and a drain region doped with dopants, and a channel region.

The semiconductor layer 210 may be covered by a gate insulating film 130, and the gate electrode 220 may be disposed on the gate insulating film 130. The gate insulating film 130 may be formed to cover the entire surface of the substrate 110. In one embodiment, however, the gate insulating film 130 may be formed by being patterned. The gate insulating film 130 may include silicon oxide, silicon nitride, or other insulating organic/inorganic materials. The gate electrode 220 may include at least one material selected from the group consisting of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), or an alloy thereof to have a single-layer or multi-layer structure, in consideration of adhesion to a neighboring layer and surface flatness and processability of a layer thereon.

The gate electrode 220 and the gate insulating film 130 may be covered by an interlayer insulating film 140 including silicon oxide, silicon nitride, and/or other insulating organic/inorganic materials. The gate insulating film 130 and the interlayer insulating film 140 may be partially removed. A contact opening (or hole) formed due to the removal exposes a suitable (or predefined) region of the semiconductor layer 210. The source/drain electrodes 230 may contact the semiconductor layer 210 through the contact opening. The source/drain electrodes 230 may include at least one material selected from the group consisting of, for example, Al, Pt, Pd, Ag, Mg, Au, Ni, Nd, Ir, Cr, Li, Ca, Mo, Ti, W, and Cu, or an alloy thereof to have a single-layer or multi-layer structure, in consideration of conductivity.

The TFT 200 may be covered by a protective film 150 including silicon oxide, silicon nitride, and/or other insulating organic/inorganic materials. The protective film 150 may entirely or mostly cover the substrate 110. Because the TFT 200 having a complex layer structure is disposed under the protective film 150, as shown in FIG. 1, a top surface of the protective film 150 may not be sufficiently flat. Accordingly, a planarization layer 160 having a sufficiently flat top surface may be formed on the protective film 150, as shown in FIG. 1.

The planarization layer 160 covers the substrate 110. Because the TFT 200 and the protective film 150 that covers the TFT 200 are on the substrate 110, the planarization layer 160 may cover the protective film 150. A recessed portion 160a may be formed in a top surface of the planarization layer 160. The recessed portion 160a may be formed at a position where a pixel electrode, which will be explained below, is to be formed.

The planarization layer 160 may be formed by using any of a variety of methods. For example, after a planarization layer material layer having a flat top surface is formed, a planarization layer material layer may be additionally formed on a portion other than a portion in which the recessed portion 160a is to be formed. In one embodiment, after a planarization layer material layer having a flat top surface is formed, a portion in which the recessed portion 160a is to be formed is etched, to form the planarization layer 160 of FIG. 1. Assuming that the planarization layer 160 is formed by using deposition, the planarization layer 160, including the recessed portion 160a, may be formed as shown in FIG. 1 by performing deposition one time using a half-tone mask.

After the planarization layer 160 is formed, a vial-opening (or hole) 160' may be formed in the protective film 150 and the planarization layer 160 to expose any one of the source/drain electrodes 230 of the TFT 200, as shown in FIG. 1.

Figure 2:
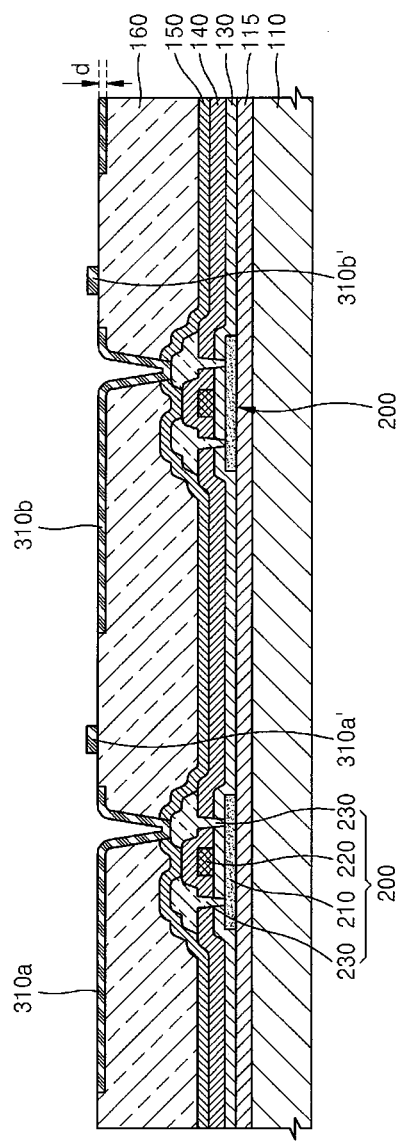

As shown in FIG. 2, pixel electrodes 310a and 310b disposed in recessed portions 160a and 160b of the planarization layer 160, and step forming units 310a' and 310b' disposed on a top surface of the planarization layer 160 outside the recessed portions 160a and 160b of the planarization layer 160 are formed. Because the pixel electrodes 310a and 310b are disposed in the recessed portions 160a and 160b of the planarization layer 160, top surfaces of the pixel electrodes 310a and 310b may be substantially level with top surfaces (other than the recessed portions 160a and 160b) of the planarization layer 160.

The pixel electrodes 310a and 310b and the step forming units 310a' and 310b' may be formed such that the pixel electrodes 310a and 310b and the step forming units 310a' and 310b' are spaced apart from each other and not contacting each other. The pixel electrodes 310a and 310b may each be electrically connected to the TFT 200 disposed thereunder.

The pixel electrodes 310a and 310b and the step forming units 310a' and 310b' may be formed with the same material. Furthermore, the pixel electrodes 310a and 310b and the step forming units 310a' and 310b' may be concurrently (or simultaneously) formed by using the same process to simplify the manufacturing process. In this case, the pixel electrodes 310a and 310b and the step forming units 310a' and 310b' may have the same layer structure.

The pixel electrodes 310a and 310b may be formed as (semi)transparent electrodes or reflective electrodes. When the pixel electrodes 310a and 310b are formed as (semi) transparent electrodes, the pixel electrodes 310a and 310b may include, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrodes 310a and 310b are formed as reflective electrodes, the pixel electrodes 310a and 310b may include a reflective film including Ag, Mg, Al, Pt, Pd, Au, Ni, Nd, Ir, Cr, or a compound thereof and a film including ITO, IZO, ZnO, or $In_2O_3$. Structures and materials of the pixel electrodes 310a and 310b are not limited thereto and various modifications may be made.

Figure 3:
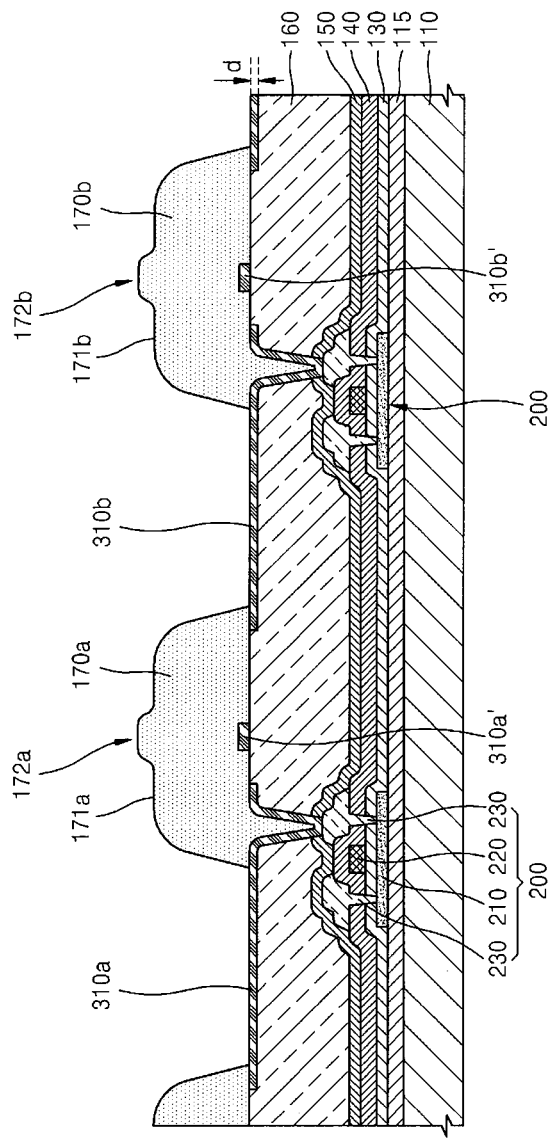
Figure 4:
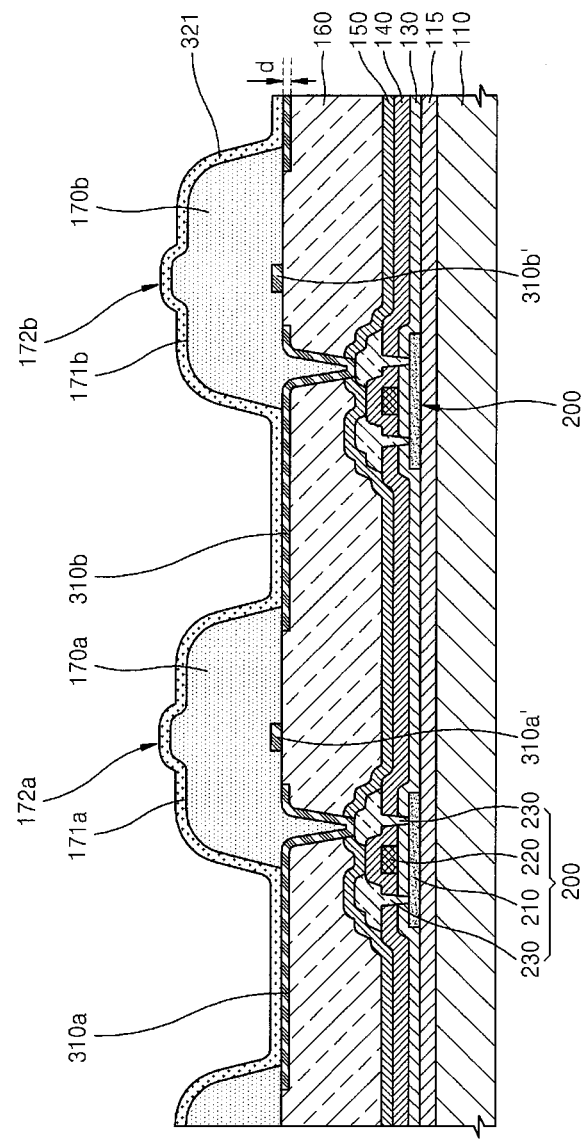

After the pixel electrodes 310a and 310b or the step forming units 310a' and 310b' are formed, pixel-defining layer (PDL) 170a and 170b may be formed as shown in FIG. 3. The PDL 170a and 170b are formed on the planarization layer 160 to cover edges of the pixel electrodes 310a and 310b. For example, the PDL 170a and 170b are formed to expose at least portions (including central portions) of the pixel electrodes 310a and 310b and to cover the step forming units 310a' and 310b'. In this case, because the PDL 170a and 170b cover the step forming units 310a' and 310b', protruding portions 172a and 172b corresponding to the step forming units 310a' and 310b' are formed on top surfaces of the PDL 170a and 170b.

While the pixel-defining layer 170a and the pixel-defining layer 170b appear spaced apart from each other in FIG. 3, which is a cross-sectional view, the pixel-defining layer 170a and the pixel-defining layer 170b may be connected to each other.

The PDL 170a and 170b define pixels by having openings corresponding to subpixels, that is, openings formed to expose the central portions of the pixel electrodes 310a and 310b. Also, because the PDL 170a and 170b increase a distance between end portions of the pixel electrodes 310a and 310b and a counter electrode 330 (see FIG. 9) disposed over the pixel electrodes 310a and 310b, the PDL 170a and 170b may prevent arcs from being formed at the end portions of the pixel electrodes 310a and 310b. The PDL 170a and 170b may include an organic material, such as polyacrylate or polyimide, or an inorganic material, such as an arbitrary inorganic film, to have a single-layer or multi-layer structure.

The PDL 170a and 170b may be formed by forming a layer on the entire surface of the substrate 110 to cover the pixel electrodes 310a and 310b and the step forming units 310a' and 310b' by using a PDL material, and patterning the layer to expose the central portions of the pixel electrodes 310a and 310b.

According to the method of manufacturing an organic light-emitting display apparatus of the present embodiment, the protruding portions 172a and 172b corresponding to the step forming units 310a' and 310b' are formed on the top surfaces of the PDL 170a and 170b due to the step forming units 310a' and 310b' as described above. When an emission layer (EML) or an intermediate layer including the EML is formed as will be described below, defects may be drastically reduced.

A first EML 321 may be formed such that the first EML 321 covers portions of the pixel electrodes 310a and 310b that are not covered by the PDL 170a and 170b and also covers the top surfaces of the PDL 170a and 170b. For example, the first EML 321 may be formed on (or to substantially correspond to) the entire surface of the substrate 110. The first EML 321 may include a material that emits, for example, blue light. When the first EML 321 is formed of a low-molecular weight material, the first EML 321 may be formed by using vacuum deposition. When the first EML 321 is formed of a high-molecular weight material, the first EML 321 may be formed by using screen printing.

Figure 5:
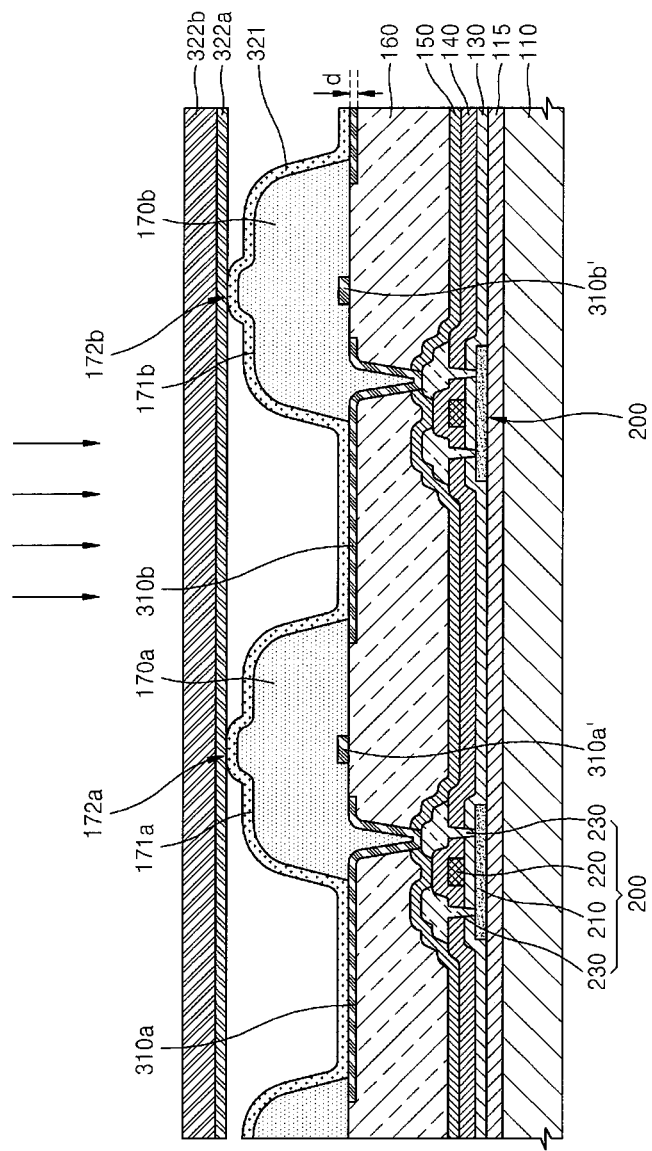
Figure 6:
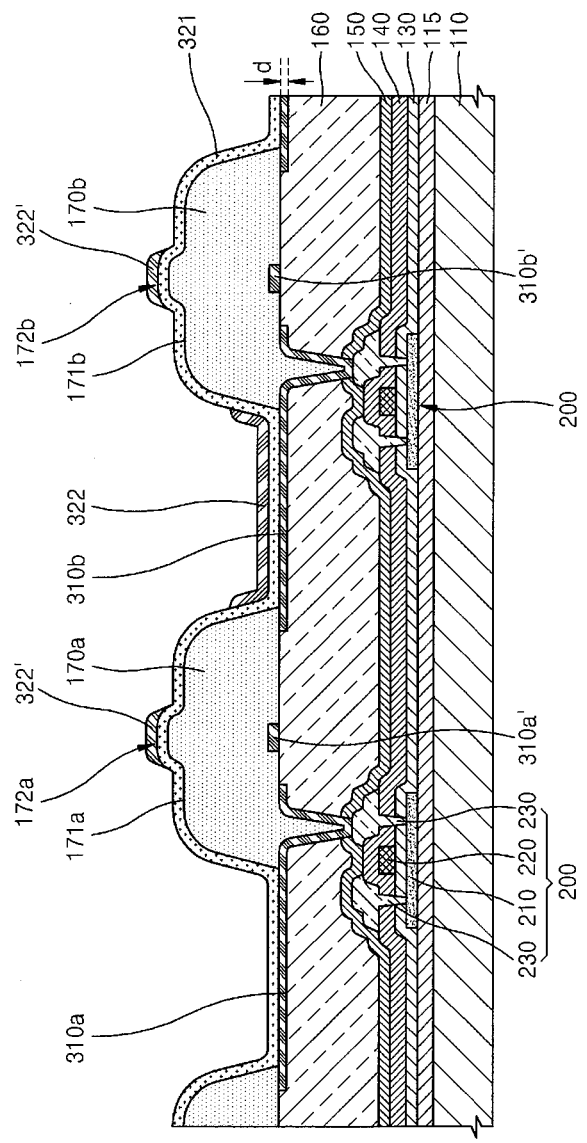

After the first EML 321 is formed, a second EML 322 is formed. The second EML 322 may include a material that emits, for example, green light. The second EML 322 may be formed by using laser-induced thermal imaging (LITI). That is, as shown in FIGS. 5 and 6, a donor film including a base film 322b and a second EML material layer 322a formed on the base film 322b may be disposed on the PDL 170a and 170b such that the second EML material layer 322a faces the PDL 170a and 170b, a laser beam may be emitted to the donor film at a position where the second EML 322 is to be formed, and a portion of the second EML material layer 322a to which the laser beam is emitted may be transferred to the pixel electrode 310b from the base film 322b. In one embodiment, the donor film may further include various layers, such as a light-heat conversion layer, disposed between the base film 322b and the second EML material layer 322a, in addition to the base film 322b and the second EML material layer 322a.

The second EML 322 may be formed on at least a portion of the pixel electrode 310b that is not covered by the PDL 170a and 170b due to the laser beam. For example, the second EML 322 may be formed on a portion of the first EML 321 that is disposed over the pixel electrode 310b. In this process, because top surfaces 171a and 171b of the PDL 170a and 170b, specifically, top surfaces of the protruding portions 172a and 172b of the PDL 170a and 170b, contact the second EML material layer 322a of the donor film, dummy second EMLs 322' may be formed on contact portions between the top surfaces of the protruding portions 172a and 172b and the second light-emitting material layer 322a irrespective of whether the laser beam is emitted to the contact portions. That is, a EML may be formed on portions of the pixel electrode 310b that are not covered by the PDL 170a and 170b and on top surfaces of the protruding portions 172a and 172b of the PDL 170a and 170b.

Because the first EML 321 is formed on the protruding portions 172a and 172b of the PDL 170a and 170b, the dummy second EMLs 322' may be formed on portions of the first EML 321 corresponding to the protruding portions 172a and 172b of the PDL 170a and 170b. Because the dummy second EMLs 322' are spaced apart from the second EML 322, the dummy second EMLs 322' are not supplied with holes or electrons from the pixel electrode 310b, and thus, do not actually emit light.

If the step forming units 310a' and 310b' are not present, and thus, the protruding portions 172a and 172b are not formed on the top surfaces 171a and 171b of the PDL 170a and 170b and the top surfaces 171a and 171b are flat, a contact area between the PDL 170a and 170b and the second EML material layer 322a of the donor film is increased. Accordingly, the dummy second EMLs 322' are formed on the top surfaces 171a and 171b of the PDL 170a and 170b with a large area.

In this case, the dummy second EMLs 322' having a large area on the top surfaces 171a and 171b of the PDL 170a and 170b may be connected to the second EML 322 disposed on the pixel electrode 310b and may actually emit light. This means that a total area of the second EML 322 may be different from a preset area according to pixels, thereby leading to a defective organic light-emitting display apparatus.

However, according to the method of manufacturing an organic light-emitting display apparatus of the present embodiment, because the step forming units 310a' and 310b' are present, the protruding portions 172a and 172b are formed on portions of the top surfaces 171a and 171b of the PDL 170a and 170b and a contact area between the PDL 170a and 170b and the second EML material layer 322a of the donor film is drastically reduced.

Also, because only top surfaces of the protruding portions 172a and 172b of the PDL 170a and 170b contact the second EML material layer 322a of the donor film, even when the dummy second EMLs 322' are formed on the contact portions, the dummy second EMLs 322' are spaced apart from the second EML 322, and thus, are not supplied with holes or electrons from the pixel electrode 310b and do not actually emit light. Accordingly, because an area of the second EML 322 accurately corresponds to a preset area, a high-quality organic light-emitting display apparatus may be manufactured.

Figure 7:
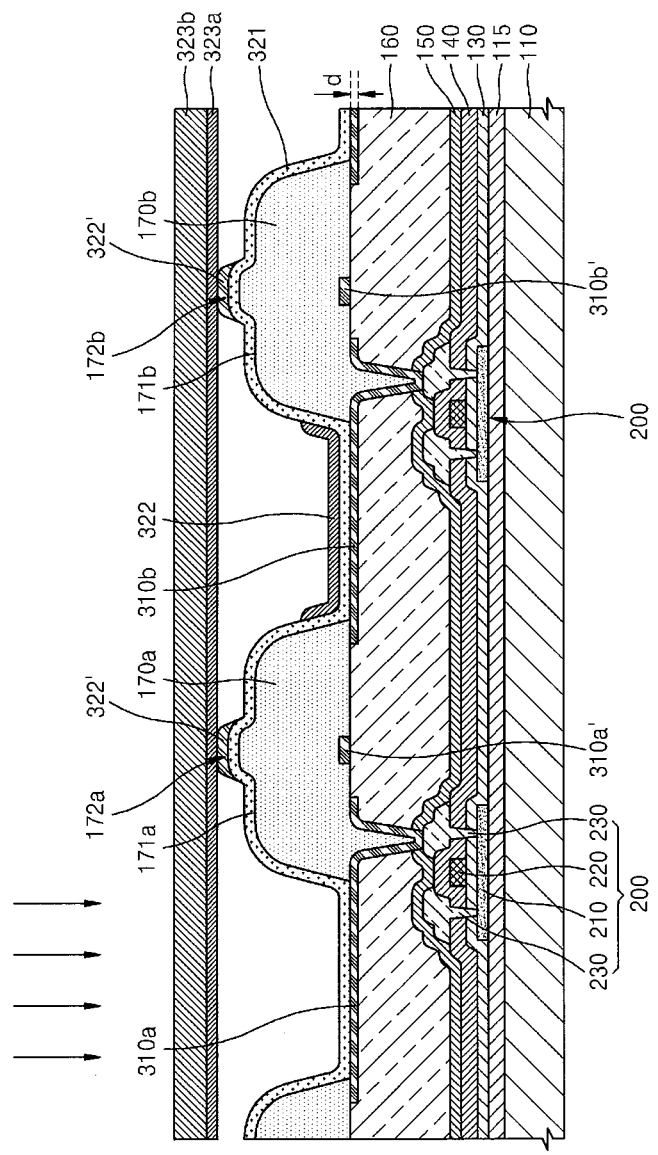
Figure 8:
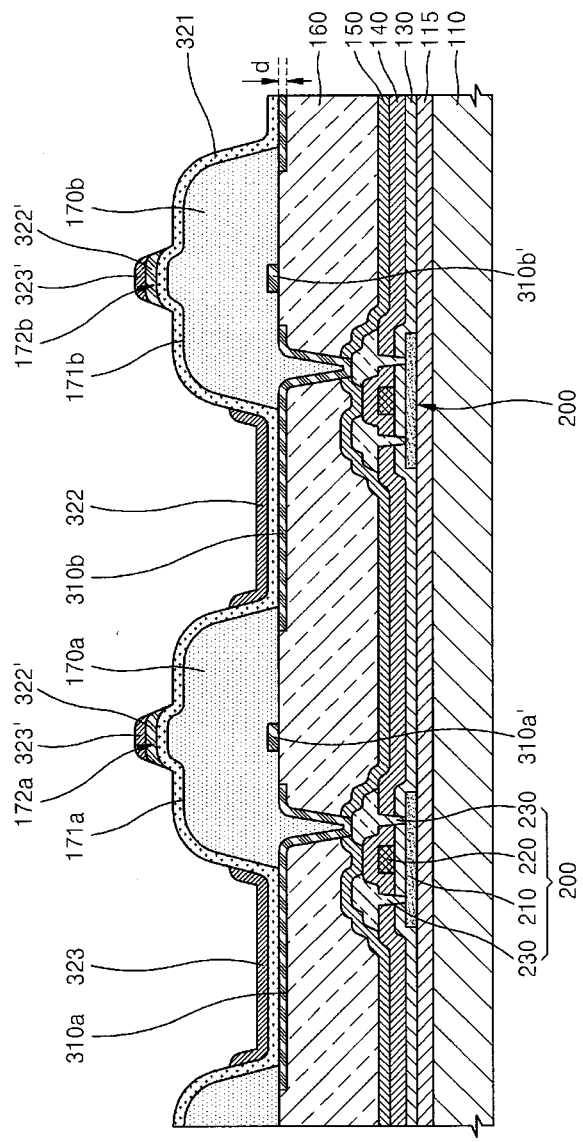

Next, as shown in FIGS. 7 and 8, a third EML 323 is formed. The third EML 323 may include a material that emits, for example, red light. The third EML 323 may be formed by using LITI. That is, as shown in FIG. 7, a donor film including a base film 323b and a third EML material layer 323a formed on the base film 323b may be disposed on the PDL 170a and 170b such that the third EML material layer 323a faces the PDL 170a and 170b, a laser beam may be emitted to the donor film at a position corresponding to the pixel electrode 310a, and a portion of the third EML material layer 323a to which the laser beam is emitted may be transferred to the pixel electrode 310a from the base film 323b. In one embodiment, the donor film may further include various films, such as a light-heat conversion layer, disposed between the base film 323b and the third EML material layer 323a in addition to the base film 323b and the third EML material layer 323a.

In this process, the third EML 323 is formed on at least a portion of the pixel electrode 310a that is not covered by the pixel-defining layer 170a due to the laser beam. For example, the third EML 323 is formed on a portion of the first EML 321 that is disposed over the pixel electrode 310a. In this process, because the top surfaces 171a and 171b of the PDL 170a and 170b, specifically, the top surfaces of the protruding portions 172a and 172b of the PDL 170a and 170b, contact the third EML material layer 323a of the donor film, dummy third EMLs 323' may be formed on contact portions between the top surfaces of the protruding portions 172a and 172b and the third EML material layer 323a irrespective of whether the laser beam is emitted to the contact portions. Because the dummy second EMLs 322' may already be formed on the contact portions, the dummy third EMLs 323' may be formed on the dummy second EMLs 322'. Because the dummy third EMLs 323' are spaced apart from the third EML 323, the dummy third EMLs 323' are not supplied with holes or electrons, and thus, do not actually emit light. This is because the step forming units 310a' and 310b' are present and the protruding portions 172a and 172b are formed on portions of the top surfaces 171a and 171b of the PDL 170a and 170b.

Figure 9:
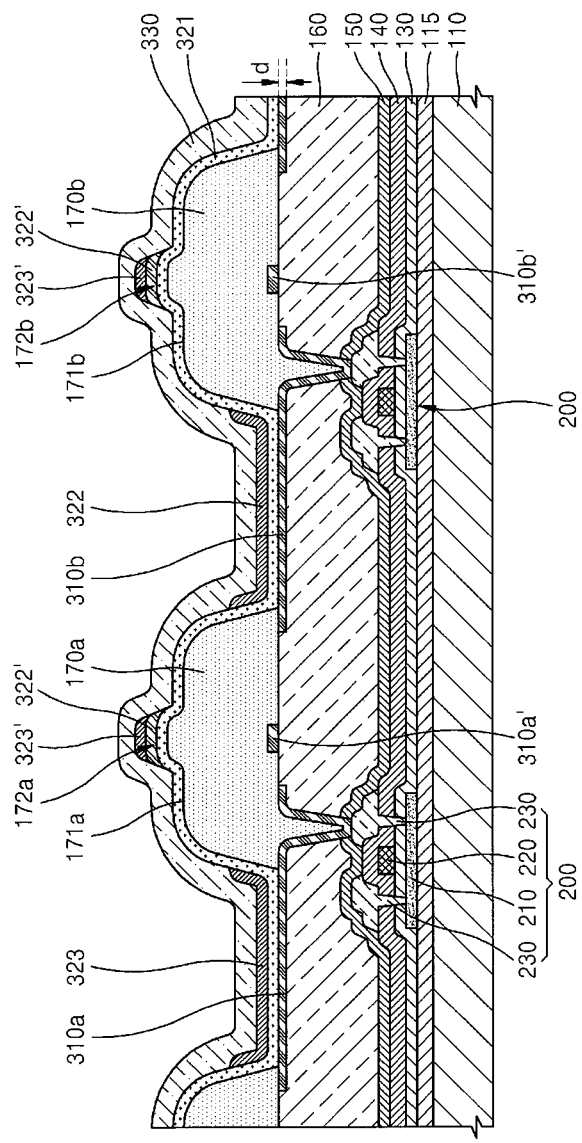
FIG. 9 is a cross-sectional view illustrating an organic light-emitting display apparatus according to another embodiment of the present invention.

The counter electrode 330 may be formed to cover the pixel electrodes 310a and 310b, thereby completely manufacturing an organic light-emitting display apparatus as shown in FIG. 9. The counter electrode 330 may be commonly formed for a plurality of (sub)pixels to cover a display area (active area). The display area refers to any area of an organic light-emitting display apparatus that may emit light. For example, the display area may refer to any area other than an edge of an organic light-emitting display apparatus on which a controller is disposed. If a dead area exists on an entire surface of an organic light-emitting display apparatus, the entire surface of the organic light-emitting display apparatus may be referred to as a display area.

The counter electrode 330 contacts an electrode power supply line outside the display area and receives an electrical signal from the electrode power supply line. The counter electrode 330 may be formed as a (semi)transparent electrode or a reflective electrode. When the counter electrode 330 is formed as a (semi)transparent electrode, the counter electrode 330 may include a film deposited such that Li, Ca, LiF/Ca, LiF/Al, Al, Mg, or a compound thereof faces an EML, and an auxiliary electrode or a bus electrode line formed of a (semi)transparent material, such as ITO, IZO, ZnO, or $In_2O_3$. When the counter electrode 330 is formed as a reflective electrode, the counter electrode 330 may include a layer including at least one material of, for example, Li, Ca, LiF/Ca, LiF/Al, Al, Ag, and Mg. A structure and a material of the counter electrode 330 are not limited thereto and various modifications may be made.

According to the method of manufacturing an organic light-emitting display apparatus of the present embodiment, an intermediate layer of each subpixel may be formed more simply with a lower defect rate than that when a conventional manufacturing method is used.

A conventional method of manufacturing an organic light-emitting display apparatus has a phenomenon that, because a mask having small through-holes respectively corresponding to subpixels is used in order to deposit different light-emitting materials according to subpixel regions, as a resolution of an organic light-emitting display apparatus increases, the through-holes of the mask get smaller and denser, thereby making it difficult to accurately deposit light-emitting materials.

However, according to the method of manufacturing an organic light-emitting display apparatus of the present embodiment, because the first EML 321 is commonly formed for all (sub)pixels, an open mask instead of a mask having small through-holes may be used. Also, because the second EML 322 and the third EML 323 are formed by emitting a laser beam at a high precision, the second EML 322 and the third EML 323 may be accurately formed at positions.

Because the step forming units 310a' and 310b' are present and the protruding portions 172a and 172b are formed on portions of the top surfaces 171a and 171b of the PDL 170a and 170b, a contact area between the PDL 170a and 170b and the second EML material layer 322a or the third EML material layer 323a of the donor film may be drastically reduced.

Also, because only top surfaces of the protruding portions 172a and 172b of the PDL 170a and 170b contact the second EML material layer 322a or the third EML material layer 323a of the donor film, even when the dummy second EMLs 322' or the dummy third EMLs 323' are formed on the contact portions, the dummy second EMLs 322' or the dummy third EMLs 323' are spaced apart from the second EML 322 or the third EML 323, and thus, are not supplied with holes or electrons from the pixel electrodes 310a and 310b and do not actually emit light. Accordingly, because an area of the second EML 322 or the third EML 323 accurately corresponds to a predefined area, a high-quality organic light-emitting display apparatus may be manufactured.

Although the first EML 321 is formed and then the second EML 322 and the third EML 323 are formed, embodiments are not limited thereto. For example, the second EML 322 and the third EML 323 may be formed and then the first EML 321 may be formed. In one embodiment, the second EML 322 may be formed, and the first EML 321 may be formed before the third EML 323 is formed.

Also, although only a EML is disposed between the pixel electrodes 310a and 310b and the counter electrode 330 for convenience of explanation, the present embodiment is not limited thereto. For example, in one embodiment, in addition to the EML, a hole injection layer (HIL), a hole transport layer (HTL), an interlayer or a primer layer, an electron transport layer (ETL), and/or an electron injection layer (EIL) may be disposed between the pixel electrodes 310a and 310b and the counter electrode 330. At least some of the above layers may be formed at the same time as the EML is formed by using LITI, or may be formed by using a separate process such as deposition.

In one embodiment, a region of the pixel electrode 310a may emit a mixture of, for example, blue light and red light, and a region of the pixel electrode 310b may emit a mixture of, for example, blue light and green light. Only the first EML 321 may be present in a region of a pixel electrode at the right end of FIG. 9, and thus, the region may emit, for example, blue light. A full-color organic light-emitting display apparatus may be obtained by adjusting the amount of light emitted from each subpixel.

Figure 10:
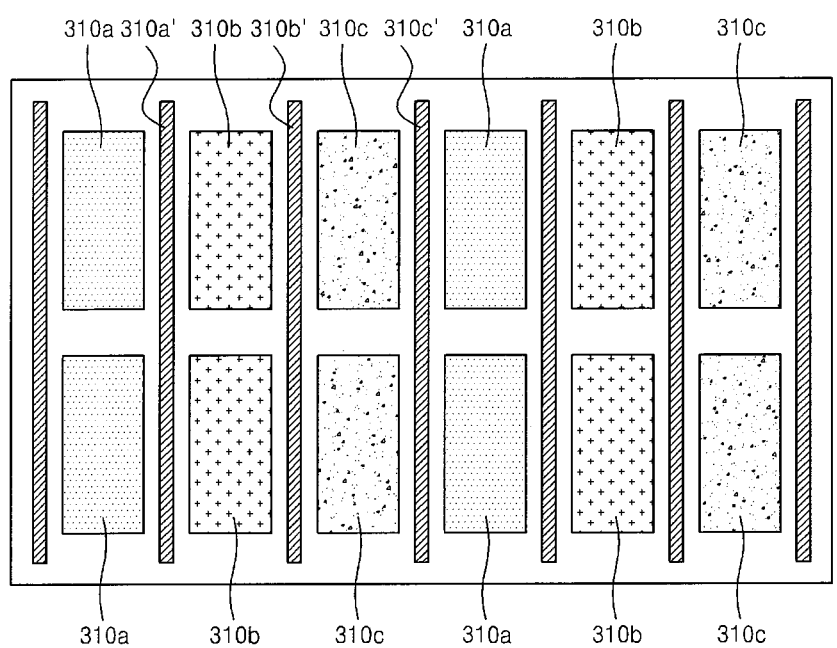
FIG. 10 is a plan view illustrating a portion of the organic light-emitting display apparatus according to an embodiment of the present invention.

The step forming units 310a' and 310b' may be formed to have various shapes. For example, as shown in FIG. 10, the step forming unit 310a' may be formed between the pixel electrode 310a and the pixel electrode 310b, the step forming unit 310b' may be formed between the pixel electrode 310b and the pixel electrode 310c, and a step forming unit 310c' may be formed between a pixel electrode 310c and the pixel electrode 310a. The step forming units 310a', 310b', and 310c' may have stripe shapes extending in one direction, as shown in FIG. 10.

Figure 11:
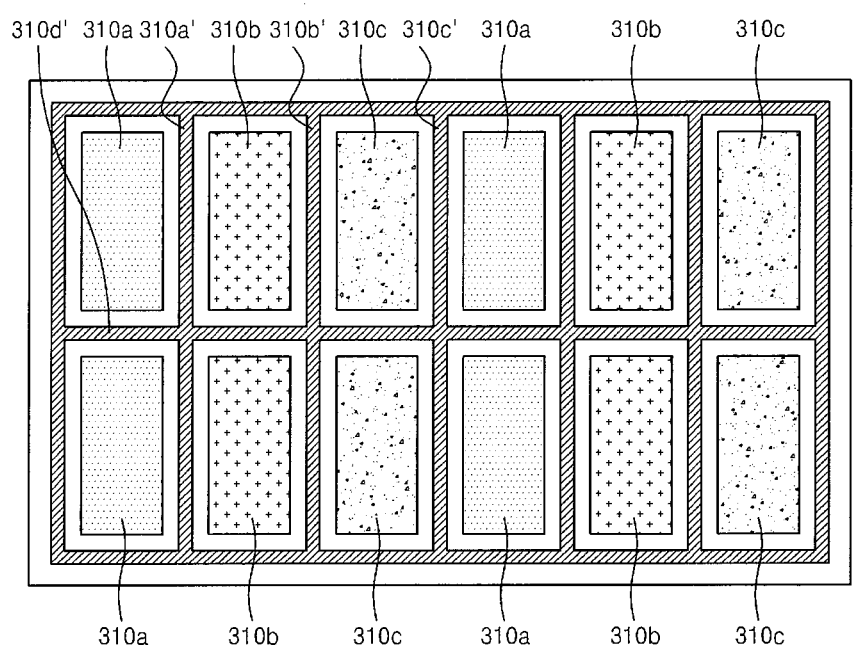
FIG. 11 is a plan view illustrating a portion of the organic light-emitting display apparatus according to another embodiment of the present invention.

In one embodiment, as shown in FIG. 11, a step forming unit 310d' having a stripe shape may be formed to extend in a direction intersecting a direction in which the step forming units 310a', 310b', and 310c' extend to connect the step forming units 310a', 310b', and 310c', and thus, the step forming unit 310d' may surround each of the pixel electrodes 310a, 310b, and 310c on the planarization layer 160.

Figure 12:
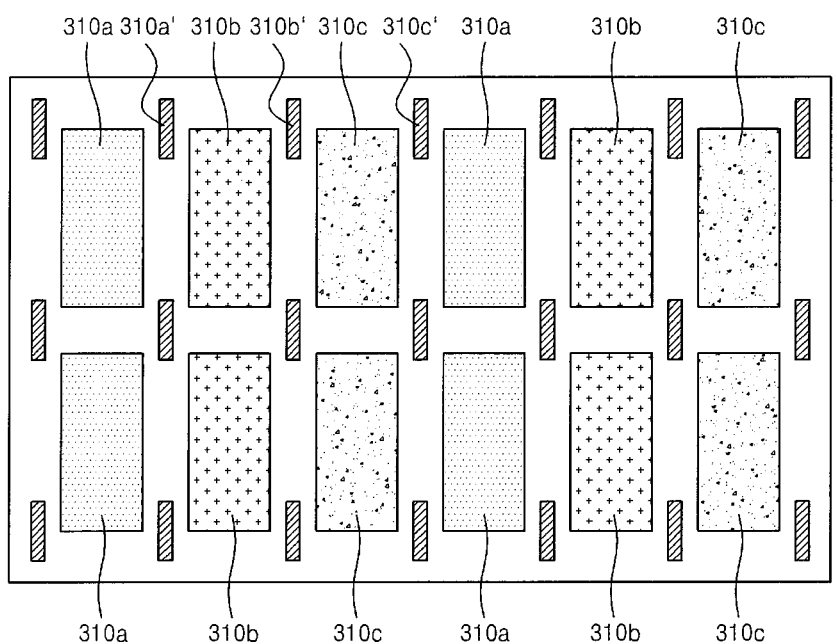
FIG. 12 is a plan view illustrating a portion of the organic light-emitting display apparatus according to another embodiment of the present invention.

In one embodiment, as shown in FIG. 12, the step forming unit 310a' may extend intermittently. The step forming unit 310b' or the step forming unit 310c' may also extend intermittently.

Figure 13:
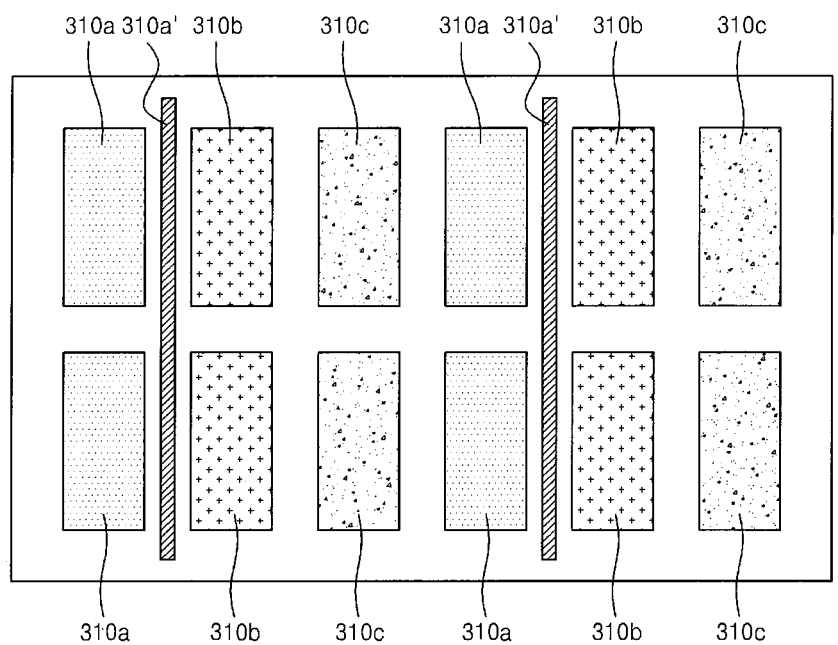
FIG. 13 is a plan view illustrating a portion of the organic light-emitting display apparatus according to another embodiment of the present invention.

In one embodiment, as shown in FIG. 13, the step forming unit 310a' may extend in a stripe shape in one direction only between the pixel electrode 310a and the pixel electrode 310b, and no step forming unit may be present between the pixel electrode 310b and the pixel electrode 310c and between the pixel electrode 310c and the pixel electrode 310a.

Although methods of manufacturing an organic light-emitting display apparatus have been described above, the present invention is not limited thereto and an organic light-emitting display apparatus is also within the scope of the present invention.

For example, an organic light-emitting display apparatus of FIG. 9 includes the substrate 110, the planarization layer 160, the pixel electrodes 310a and 310b, the step forming units 310a' and 310b', and the PDL 170a and 170b. The organic light-emitting display apparatus may further include the first EML 321, the second EML 322, the third EML 323, and the counter electrode 330.

A top surface of the planarization layer 160 is substantially flat but the planarization layer 160 includes the recessed portions 160a and 160b in which the pixel electrodes 310a and 310b may be arranged (or located). The step forming units 310a' and 310b' are on a top surface of the planarization layer 160 outside the recessed portions 160a and 160b of the planarization layer 160. The pixel electrodes 310a and 310b and the step forming units 310a' and 310b' may be spaced apart from each other and not contacting each other.

The PDL 170a and 170b expose at least portions (including central portions) of the pixel electrodes 310a and 310b, cover the step forming units 310a' and 310', and include the protruding portions 172a and 172b on the top surfaces 171a and 171b to correspond to the step forming units 310a' and 310b'.

While the first EML 321 may cover the pixel electrode 310a, the pixel electrode 310b, and a pixel electrode shown at the right end, the second EML 322 may be on portions of the pixel electrode 310b that is not covered by the PDL 170a and 170b, and the third EML 323 may be on a portion of the pixel electrode 310a that is not covered by the pixel-defining layer 170a. The dummy second EMLs 322' and the dummy third EMLs 323' may be on top surfaces of the protruding portions 172a and 172b of the PDL 170a and 170b. Assuming that the dummy second EMLs 322' and the dummy third EMLs 323' are regarded as second EMLs and third EMLs, the second EMLs may be on portions of the pixel electrode that are not covered by the PDL 170a and 170b and top surfaces of the protruding portions 172a and 172b of the PDL 170a and 170b, and the third EMLs may be on portions of the pixel electrode 310a that are not covered by the pixel-defining layer 170a and the top surfaces of the protruding portions 172a and 172b of the PDL 170a and 170b. The dummy second EMLs 322' and the dummy third EMLs 323' may be spaced apart from the second EML 322 and the third EML 323, respectively.

According to the organic light-emitting display apparatus of the present embodiment, because the step forming units 310a' and 310b' are present and the protruding portions 172a and 172b are formed on portions of the top surfaces 171a and 171b of the PDL 170a and 170b, a contact area between the PDL 170a and 170b and the second EML material layer 322a (see FIG. 5) or the third EML material layer 323a (see FIG. 7) of the donor film may be drastically reduced when the second EML 322 or the third EML 323 is formed.

Also, because only top surfaces of the protruding portions 172a and 172b of the PDL 170a and 170b contact the second EML material layer 322a or the third EML material layer 323a of the donor film, even when the dummy second EMLs 322' or the dummy third EMLs 323' are formed on the contact portions, the dummy second EMLs 322' or the dummy third EMLs 323' are spaced apart from the second EML 322 or the third EML 323, and thus, are not supplied with holes or electrons from the pixel electrodes 310a and 310b and do not actually emit light. Accordingly, because an area of the second EML 322 or the third EML 323 accurately corresponds to a predefined area, a high-quality organic light-emitting display apparatus may be obtained.

The pixel electrodes 310a and 310b and the step forming units 310a' and 310b' may include the same material and may have the same layer structure because the pixel electrodes 310a and 310b and the step forming units 310a' and 310b' may be concurrently (or simultaneously) formed by using the same process.

The step forming units 310a' and 310b' may have various shapes. For example, as shown in FIG. 10, the step forming unit 310a' may be between the pixel electrode 310a and the pixel electrode 310b, the step forming unit 3140b may be between the pixel electrode 310b and the pixel electrode 3140c, and the step forming unit 310c' may be between the pixel electrode 310c and the pixel electrode 310a. The step forming units 310a', 310b', and 310c' may have stripe shapes extending in one direction, as shown in FIG. 10.

In one embodiment, the step forming unit 310d' having a stripe shape may extend in a direction intersecting a direction in which the step forming units 310a', 310b', and 310c' extend and may connect the step forming units 310a', 310b', and 310c', and thus, the step forming unit 310d' may surround each of the pixel electrodes 310a, 310b, and 310c on the planarization layer 160.

In one embodiment, as shown in FIG. 12, the step forming unit 310a' may extend in one direction intermittently. The step forming unit 310b' or the step forming unit 310c' may also extend intermittently.

In one embodiment, as shown in FIG. 13, the step forming unit 310a' may extend in a stripe shape in one direction only between the pixel electrode 310a and the pixel electrode 310b, and no step forming unit may be between the pixel electrode 310b and the pixel electrode 310c and between the pixel electrode 310c and the pixel electrode 310a.

As described above, according to the one or more embodiments of the present invention, an organic light-emitting display apparatus having a very low defect rate during a manufacturing process and a method of manufacturing the organic light-emitting display apparatus may be provided. The present invention is not limited to the above effects.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display apparatus comprising:
a substrate;
a planarization layer covering the substrate and having a top surface comprising a recessed portion;
a pixel electrode in the recessed portion of the planarization layer;
a step forming unit on the top surface of the planarization layer outside of the recessed portion; and
a pixel-defining layer exposing at least a central portion of the pixel electrode, and covering the step forming unit so that a top surface of the pixel-defining layer comprises a protruding portion corresponding to the step forming unit,
wherein the pixel electrode and the step forming unit comprise the same material.

2. The organic light-emitting display apparatus of claim 1, wherein the pixel electrode and the step forming unit have a same layer structure.

3. The organic light-emitting display apparatus of claim 1, wherein the step forming unit surrounds the pixel electrode on the planarization layer.

4. The organic light-emitting display apparatus of claim 1, further comprising a neighboring pixel electrode adjacent to the pixel electrode,
wherein the planarization layer comprises a neighboring recessed portion adjacent to the recessed portion and spaced apart from the recessed portion,
wherein the neighboring pixel electrode is in the neighboring recessed portion, and
wherein the step forming unit is between the pixel electrode and the neighboring pixel electrode.

5. An organic light-emitting display apparatus comprising:
a substrate;
a planarization layer covering the substrate and having a top surface comprising a recessed portion;
a pixel electrode in the recessed portion of the planarization layer;
a step forming unit on the top surface of the planarization layer outside of the recessed portion; and
a pixel-defining layer exposing at least a central portion of the pixel electrode, and covering the step forming unit so that a top surface of the pixel-defining layer comprises a protruding portion corresponding to the step forming unit,
wherein the pixel electrode and the step forming unit are spaced apart from each other and do not contact each other.

6. The organic light-emitting display apparatus of claim 5, wherein the pixel electrode and the step forming unit comprise a same material.

7. An organic light-emitting display apparatus comprising;
a substrate;
a planarization layer covering the substrate and having a top surface comprising a recessed portion;
a pixel electrode in the recessed portion of the planarization layer;
a step forming unit on the top surface of the planarization layer outside of the recessed portion;
a pixel-defining layer exposing at least a central portion of the pixel electrode, and covering the step forming unit so that a top surface of the pixel-defining layer comprises a protruding portion corresponding to the step forming unit; and
an emission layer on a portion of the pixel electrode not covered by the pixel-defining layer, and on a top surface portion of the protruding portion of the pixel-defining layer, the top surface portion being a part of the pixel-defining layer farthest from a bottom surface of the pixel-defining layer.

8. The organic light-emitting display apparatus of claim 7, wherein the emission layer on the portion of the pixel electrode not covered by the pixel-defining layer and the emission layer on the top surface of the protruding portion of the pixel-defining layer are spaced apart from each other.

9. A method of manufacturing an organic light-emitting display apparatus, the method comprising:
forming a planarization layer covering a substrate and having a top surface comprising a recessed portion;
forming a pixel electrode in the recessed portion of the planarization layer;
forming a step forming unit on the top surface of the planarization layer outside of the recessed portion; and
forming a pixel-defining layer that exposes at least a central portion of the pixel electrode, and covers the step forming unit so that a top surface of the pixel-defining layer comprises a protruding portion corresponding to the step forming unit, wherein the pixel electrode and the step forming unit comprise the same material.

10. The method of claim 9, wherein the forming of the pixel electrode and the step forming unit comprises forming the pixel electrode and the step forming unit such that the pixel electrode and the step forming unit are spaced apart from each other and are not contacting each other.

11. The method of claim 9, wherein the forming of the planarization layer comprises forming the planarization layer using a half-tone mask.

12. The method of claim 9, further comprising:
forming an emission layer on a portion of the pixel electrode not covered by the pixel-defining layer and on a top surface of the protruding portion of the pixel-defining layer.

13. The method of claim 12, wherein the forming of the emission layer comprises forming the emission layer using laser-induced thermal imaging.

14. The method of claim 9, wherein the forming of the pixel electrode and the step forming unit comprises concurrently forming the pixel electrode and the step forming unit.

15. The method of claim 9, wherein the step forming unit surrounds the pixel electrode on the planarization layer.

* * * * *